United States Patent [19]

Grabbe

[11] Patent Number: 5,007,845
[45] Date of Patent: Apr. 16, 1991

[54] LOW HEIGHT CHIP CARRIER SOCKET

[75] Inventor: Dimitry G. Grabbe, Middletown, Pa.

[73] Assignee: AMP Incorporated, Harrisburg, Pa.

[21] Appl. No.: 431,519

[22] Filed: Nov. 3, 1989

[51] Int. Cl.⁵ .............................................. H01R 9/09
[52] U.S. Cl. ....................................... 439/73; 439/70;
                            439/330; 439/331; 439/526
[58] Field of Search ...................................... 439/70–73,
                            439/80, 81, 83, 330, 331, 526, 876

[56]  References Cited
U.S. PATENT DOCUMENTS

| | | | |
|---|---|---|---|
| 3,820,054 | 6/1974 | Clewes et al. | 439/73 |
| 3,942,854 | 3/1976 | Klein et al. | 439/331 |
| 4,349,238 | 9/1982 | Showman et al. | 439/70 |
| 4,354,718 | 10/1982 | Bright et al. | 439/73 |
| 4,527,850 | 7/1985 | Carter | 439/330 |
| 4,758,176 | 7/1988 | Abe et al. | 439/73 |
| 4,869,674 | 9/1989 | Pfaff | 439/526 |
| 4,872,845 | 10/1989 | Korsunsky et al. | 439/70 |

Primary Examiner—Paula A. Bradley
Attorney, Agent, or Firm—James M. Trygg

[57] ABSTRACT

The present invention sets forth a low height socket for an integrated circuit chip carrier of the "Tape Pak" type. The unique contact is arranged in the shape of a tuning fork. The chip carrier, having flexible leads projecting outwardly from its sides, is placed in the lower body of the socket with the leads resting on top of their respective tuning fork contacts. The cover, having locking members projecting downwardly and in alignment with the tuning fork contacts, is forced into engagement with the lower body so that the locking members deflect the leads downwardly, bending them about the contacting portion of the tuning fork shaped contacts. The two arms of each tuning fork then has the locking member and a respective lead wedged therebetween.

13 Claims, 5 Drawing Sheets

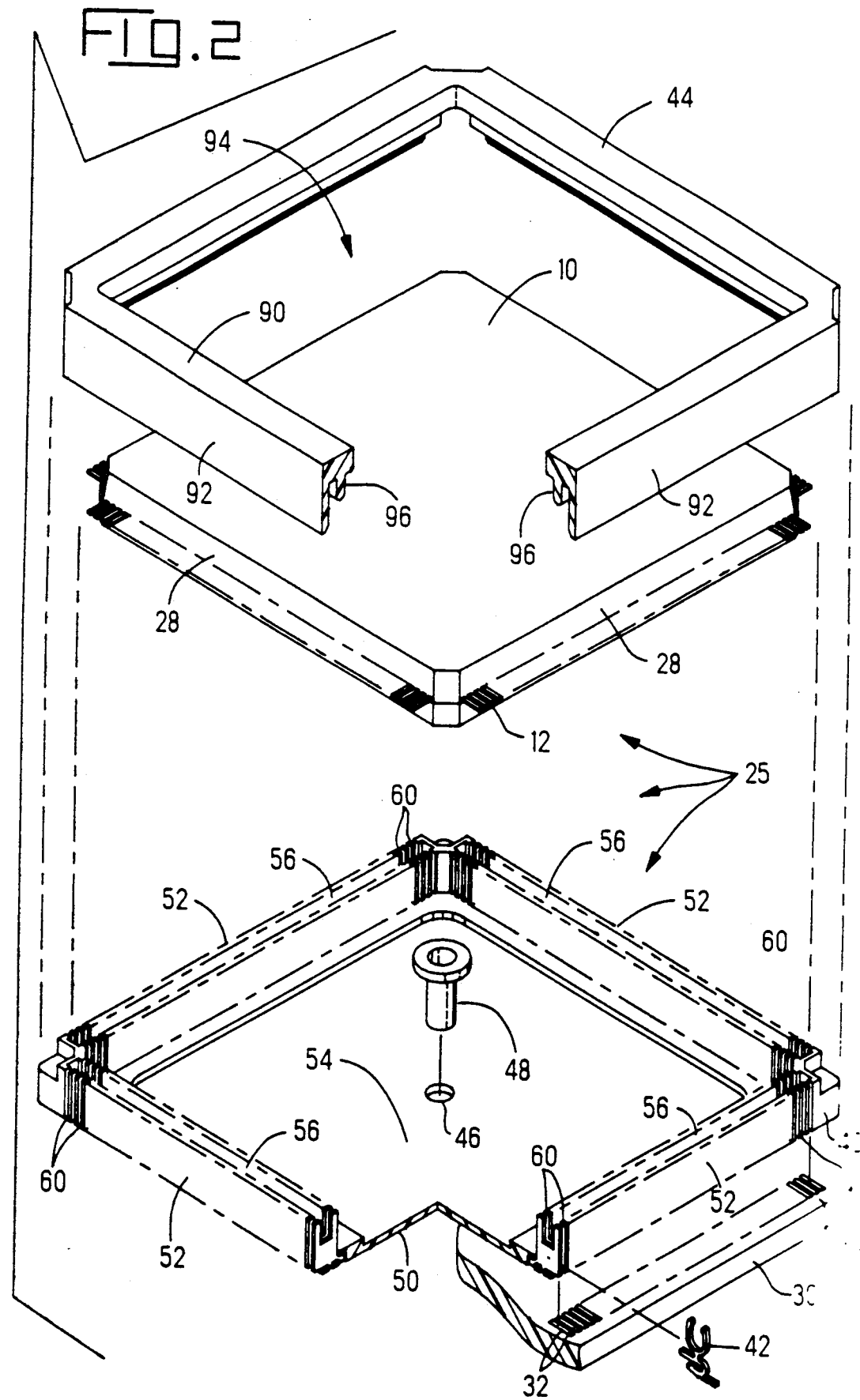

LOW HEIGHT CHIP CARRIER SOCKET

This invention relates to sockets for integrated circuit chip carriers having flexible leads and, more particularly to a low height chip carrier socket for electrically connecting such a carrier to conductors on a substrate.

There is a packaging technology for integrated circuit chips generally known in the industry as "Tape Pak". This technology involves attaching the chip to a lead frame in the usual manner, including wire bonded interconnections, and then molding a plastic carrier body which completely surrounds the chip with the leads of the lead frame extending outwardly from the sides of the body. A rectangularly shaped ring of plastic is also molded to completely surround but be spaced from the sides of the carrier body in the plane of the leads, the leads extending through the sides of the ring. Such a structure, shown in FIGS. 1 and 1A, includes a chip carrier 10 having a plurality of leads 12 extending outwardly from the four sides of the carrier 10 and through the sides of a ring 14. The lead frame 16 and the leads 12 are stamped or etched from a thin sheet of copper or other suitable material in a manner that is well known in the industry. The thickness of the material is usually about 0.005 inches and the width of the leads is typically 0.010 inches or less. Typically, several lead frames 16 are formed end to end in a strip, as shown in FIG. 1, so that several IC carrier packages can be formed simultaneously. After molding they are separated by shearing, for example, along the line 18.

The outer portions 20 of the lead frame 16 are then sheared off leaving the individual extensions 22 of the leads 12 projecting from the ring 14. These projections are then bent about 90 degrees against the outer edge of the ring and are available for contacting. The device is then placed into a socket which makes contact with each lead extension 22 for purposes of testing the integrated circuit and for exercising the integrated circuit at a high temperature in order to accelerate manifestations of possible failure modes of the device, more commonly known in the industry as "burn-in."

After testing and burn-in, the ring 14 is removed by severing the individual leads 12 close to the ring 14. The leads 12 may then be formed in accordance with industry accepted specifications developed by JCII Standards Committee (JEDEC) prior to soldering or socketing. The complex trimming and forming operations required by the JEDEC specifications are expensive to perform and result in relatively low yield. Further, some of the dimensions are specified with very liberal tolerances which adds to the difficulty of providing a highly reliable socket. The difficulty is in handling and connecting to such extremely fragile leads.

What is needed is a greatly simplified procedure and apparatus for socketing such devices while providing highly reliable socket interconnections, and at low height.

SUMMARY OF THE INVENTION

The foregoing and additional objects are attained in accordance with the principles of this invention by providing a low height chip carrier socket for electrically connecting leads on the chip carrier to respective pads on a mounting surface. The leads are spaced apart and project from a peripheral edge of the chip carrier. The socket includes a base having a chip carrier receiving cavity and a plurality of contacts in the base for electrically connecting each lead to a respective printed circuit board pad. Each contact includes a contacting portion and an opposed backup portion, both of which project from a common bight portion. Means is provided for positioning and aligning each contact with a respective lead so that each lead is adjacent its respective contacting portion. Locking means is provided for wedging between each lead and its respective backup portion so that the lead is urged into pressing electrical contact with the contacting portion.

BRIEF DESCRIPTION OF THE DRAWINGS

FIG. 2 is an isometric view showing the chip carrier of FIG. 1 in relation to the socket of the present invention;

DETAILED DESCRIPTION OF THE PREFERRED EMBODIMENT

Figure 3:
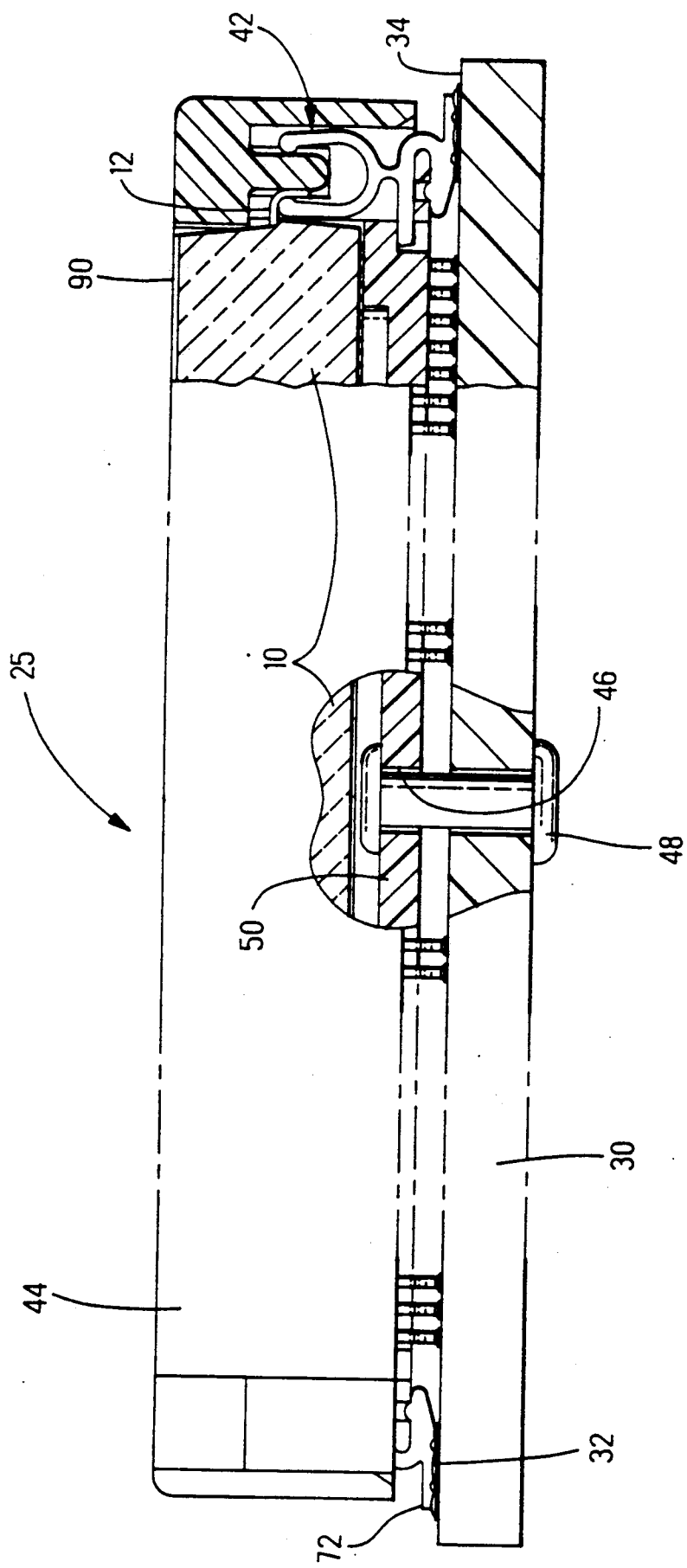
FIG. 3 is a side view of the assembled socket of FIG. 2.

There is shown in FIGS. 2 and 3 an integrated circuit chip carrier socket 25 for socketing the chip carrier 10. The chip carrier 10, in the present example, has relatively short leads 12 projecting outwardly from the edges 28. The leads 12 are spaced apart and are substantially flat and straight after being severed from the ring 14 shown in FIG. 1. A substrate or printed circuit board (PCB) 30 is shown having conductive pads 32 arranged in a rectangular pattern on a major surface 34 of the PCB 30. The purpose of the socket 25, of the present invention, is to interconnect the leads 12 with respective ones of the pads 32.

Figure 1:
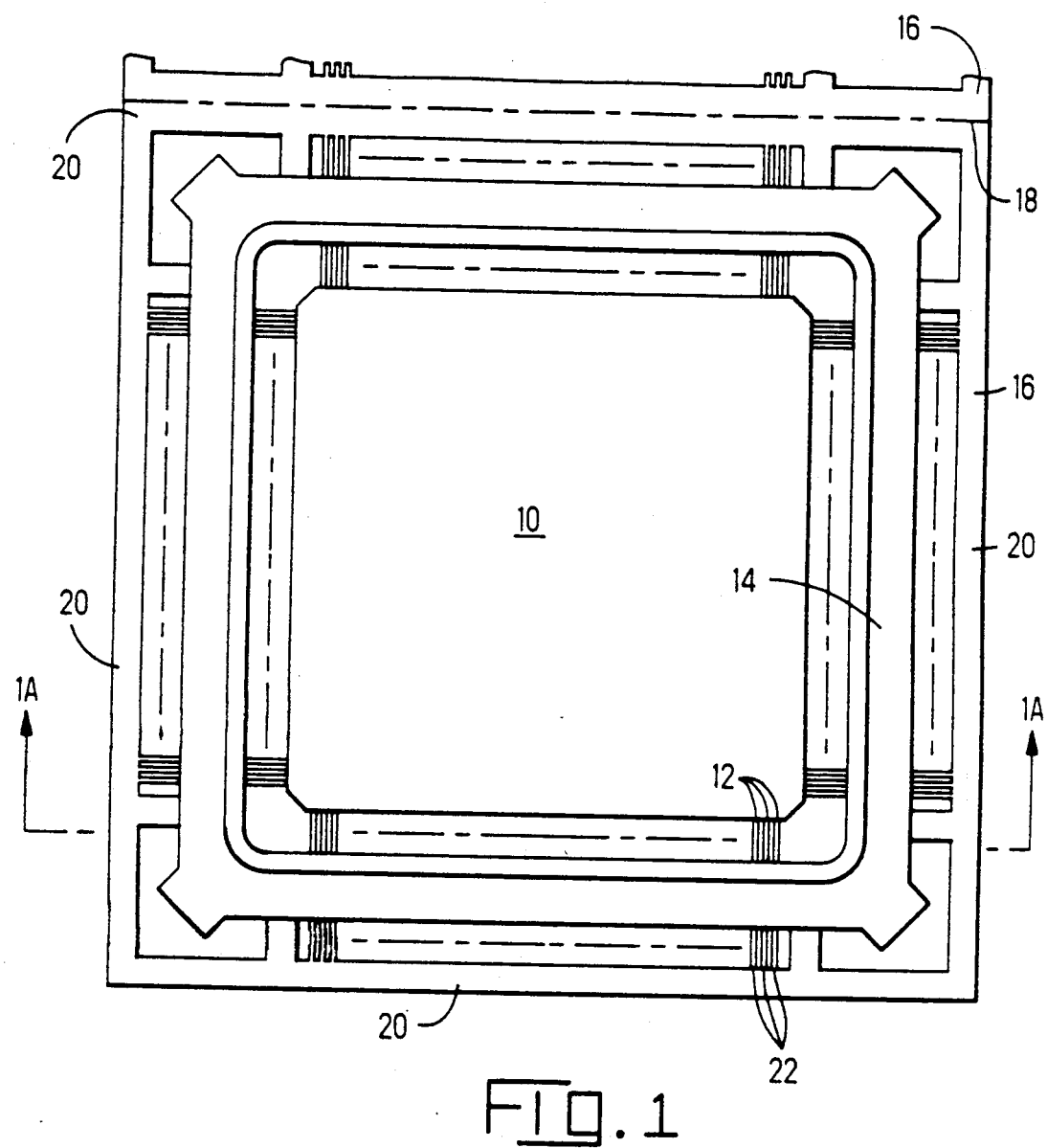
FIG. 1 is a plan view of a Tape-Pak structure showing an integrated circuit chip carrier.
Figure 1A:
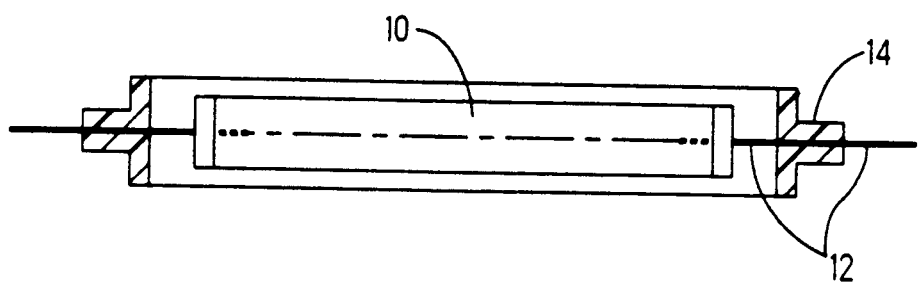
FIG. 1A is a sectional view taken along the lines 1A—1A of FIG. 1.
Figure 4:
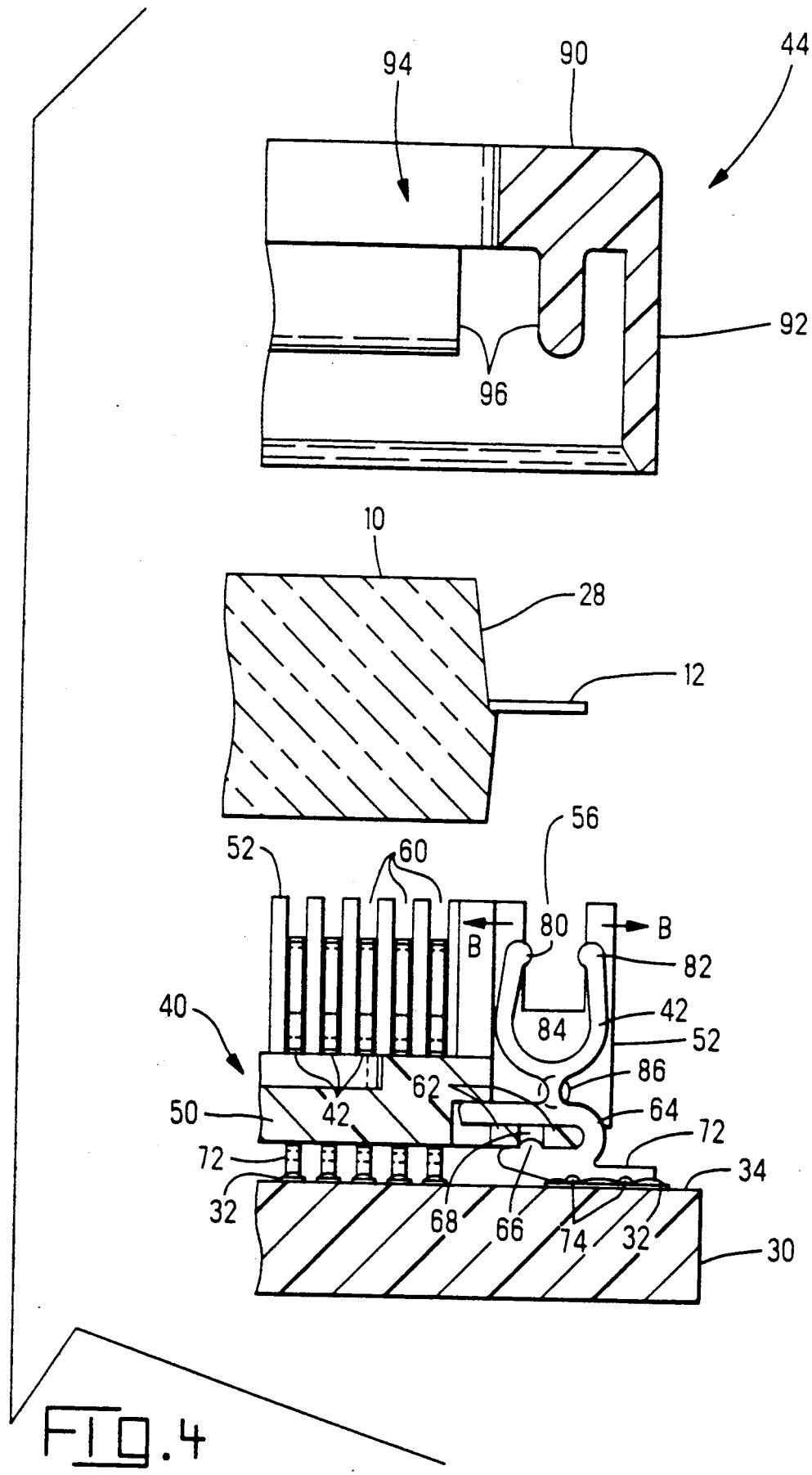
FIG. 4 is a partial sectional view showing the chip carrier and the components of the socket prior to insertion and assembly.

The socket 25 is composed of a body 40, a plurality of contacts 42, and a cover 44. A central hole 46 is provided through the body 40 through which a rivet or eyelet 48 is inserted for fastening the socket 25 to the PCB 30 prior to soldering. The body 40 includes a bottom 50 and four upstanding walls 52 which form a chip carrier receiving cavity 54 therewithin. The bottom 50 and walls 52 are of molded plastic unitary construction. A longitudinal groove 56 is formed in each wall 52 as shown in FIGS. 2 and 4, for a purpose that will be discussed below. A plurality of lateral slots 60 are formed through each wall 52 as shown in FIG. 1 and are dimensioned to loosely receive the contact 42 therein, as best seen in FIG. 4. The slots 60, which may be as little as 0.010 of an inch wide to 0.5 mm or more, depending on the width of the leads 12, are arranged to leave a bottom web 62 which interconnects the bottom 50 and the remaining portions of the wall 52 for added strength. The slots 60 are spaced so that when the socket 25 is properly aligned and attached to the PCB 34 by means of the rivet 48, each slot 60 is directly over a respective one of the pads 32.

The contact 42, as best seen in FIG. 4 is made of a single piece of flat sheet metal, such as copper alloy for example, having a thickness that is about the same as the width of the leads 12, about 0.010 of an inch in the present example. The contact 42 includes a U-shaped base 64 which is sized to closely slip over the web 62. A small protrusion 66 is formed on one of the inner surfaces of the U-shaped base 64 in a position to engage a hole 68 disposed in the web 62 so that as the contact 42 is inserted into the slot 60 in the direction of the arrow 70 of FIG. 2, the U-shaped base snaps firmly into place about the web. A terminal 72 extends from one side of the U-shaped base 64 and into engagement with the pad 32 as best seen in FIG. 4. A pair of openings 74 are provided in the pad engaging surface of the terminal 72 to provide space for solder to accumulate when the terminal is soldered to the pad. The contact 42 also includes a tuning fork portion projecting upwardly from the base 64 into the slot 60 which includes a contacting portion 80 and an opposed backup portion 82. The contacting portion 80 and backup portion 82 both project from a common bight 84 which is attached to the U-shaped base 64 through a pivotal zone 86. The pivotal zone 86 is a relatively narrow section which permits a small amount of pivotal movement of the tuning fork in the directions of the arrows B as shown in FIG. 4. The purpose of this pivotal zone 86 will be set forth below. The terminal 72 extends outwardly from the wall 52 to permit reflow soldering by a reflow heating tool, focused infrared radiation, hot gas flow, or other such reflow techniques. This also permits optical inspection of the soldered terminal. As set forth above, the openings 74 in the pad engaging surface of the terminal 72 create a condition that is conducive to the formation of solder fillets thereby enabling the soldered interface to be stronger than it would otherwise be. Those skilled in the art will appreciate that the terminal 72, instead of being arranged for surface soldering, could be arranged to extend downwardly through a plated through hole, or the like, formed in the PCB 30 in a manner that is well known in the industry. In the present example where the terminals 72 are surface mounted, the body 40, containing the contacts 42 in the slots 60, is accurately positioned on the surface 34 of the PCB 30 so that the terminals 72 are in alignment with their respective pads 32. The rivet or eyelet 48 is then inserted into the hole 46 and through a hole in the PCB 30. The rivet or eyelet 48 is peened to provide a downward force on the bottom 50 that slightly deflects the center of the bottom 50 toward the surface 34 of the PCB 30. This downward deflection of the bottom 50 tends to cause all of the terminals 72 to come into engaging contact with their respective pads 32, or at least to come very close thereto. In this way, minor variations in the flatness of the PCB 30 can be tolerated.

Figure 6:
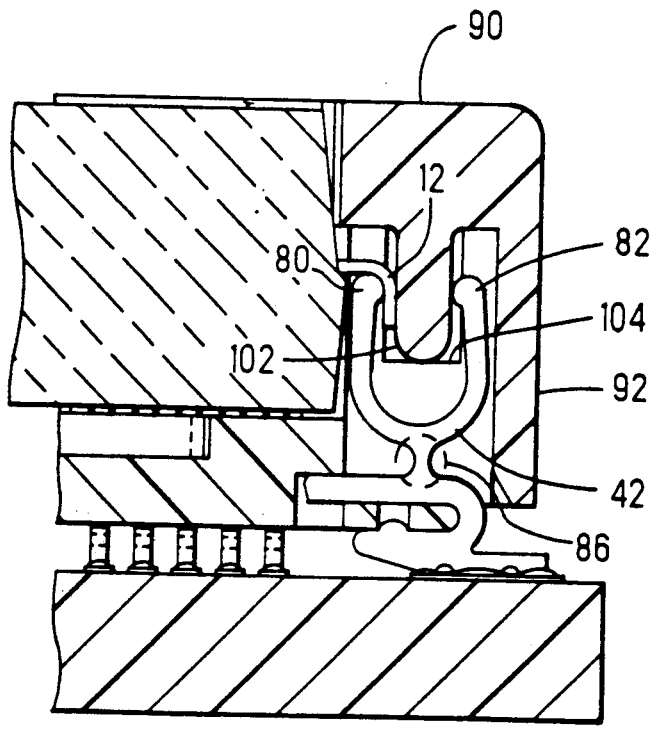
FIG. 6 is a view similar to that of FIG. 5 showing the chip carrier and socket completely assembled.

The cover 44, as best seen in FIGS. 2 and 4, comprises a rectangularly shaped top 90 being of the approximate shape and dimensions of the body 40 and includes a peripheral shroud 92 projecting downwardly from the four sides of the top 90. The top 90 is dimensioned so that the peripheral shroud 92 will slip over the body 40 with minimum clearance between the wall 52 and the shroud 92. The top 90 has a clearance opening 94 so that, when assembled to the body 40, as shown in FIG. 6, the carrier body 10 may project part way into the opening 94. The top 90 includes a locking member 96 which projects downwardly, as viewed in FIG. 4, and is spaced from the shroud 92 so that it will be in approximate centering alignment with the slot 56. The top 90 includes such a locking member 96 for each slot 56 that runs for substantially the length of the slot. Therefore, when the top 90, chip carrier 10, and base 40 are assembled as shown in FIG. 6, the locking member 96 is positioned within its respective slot 56.

Figure 5:
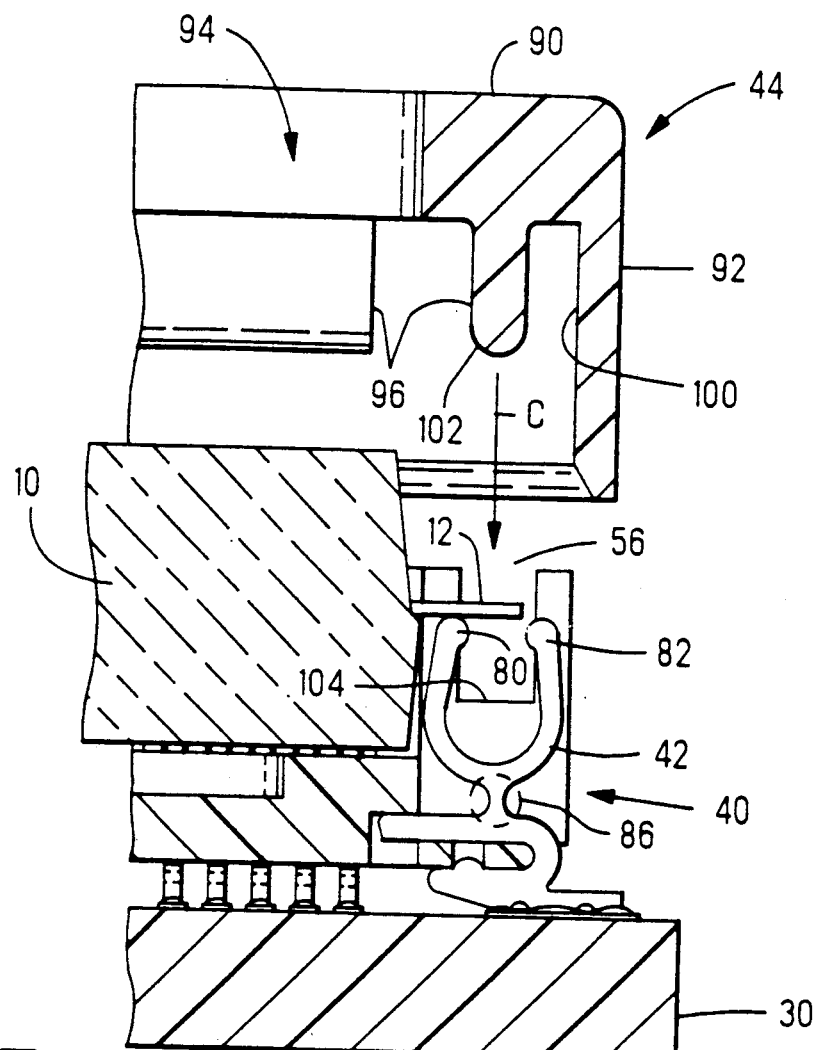
FIG. 5 is a view similar to that of FIG. 4 showing the chip carrier inserted into the lower half of the socket.

Prior to inserting a chip carrier 10 into the socket 25, the leads 12 are sheared to a specific length leaving them flat and straight. The length of the sheared leads is very short, approximately 1.5 mm in the present example. The carrier 10 is then placed in the body 40, as best seen in FIG. 5, so that all of the leads 12 are loosely positioned within their respective slots 60. The cavity 54 and slots 60 are dimensioned so that the cavity 54 loosely aligns the carrier 10 as the carrier enters the cavity thereby aligning the leads 12 with the slots 60. Note that no force is required in placing the carrier into the cavity 54. As seen in FIG. 5, the leads 12 rest on top of the contacting portions 80 and extend toward but are short of the backup portions 82. Note also that the contacting portion 80 and backup portion 82 are substantially centered with the groove 56 which is to provide clearance for the locking member 96.

With the chip carrier 10 in position within the base 40, the cover 44 is lowered toward the base 44 as indicated by the arrow in FIG. 5. The inner surface 100 of the shroud 92 engages the walls 52 thereby aligning the locking members 96 with the grooves 56. As the cover 44 is further lowered the rounded ends 102 of the locking members 96 engage the leads 12 and begins to deflect them downwardly, bending them about the contacting portions 80 of their respective contacts 42. Note that the rounded end 102 is a camming surface which may take the form of an angled surface or other suitable shape. This downward motion continues until the rounded ends 102 engage the bottoms 104 of the slots 56. At this point the leads 12 have been bent about 90 degrees downwardly, as viewed in FIG. 6, and are pressed against and into electrical contact with their respective contacting portions 80. This pressing of the lead 12 against its contacting portion 80 is effected by means of energy stored in the expanded tuning fork which acts in a direction lateral to the bent lead 12.

The distance between the contacting and backup portions 80 and 82 is less than the combined thickness of the locking number 96 and the lead 12 so that the tuning fork is caused to expand when the cover 44 is assembled as described above. This assures a contact force of about 150 grams between the contacting portion 80 and the lead 12. It is understood that the locking members 96 may not be perfectly straight or all of the contacts 42 in perfect alignment therewith. To accommodate such a condition, the contact will align itself with the locking member 96 as the end 102 begins to bend the lead 12 and engages the backup portion 82, by pivoting in the appropriate direction about the pivotal zone 86 as described previously. Notwithstanding misalignment of the locking member 96 or slight warping of the body 40, the tuning fork will pivot about the pivotal zone 86 to properly position itself so that the lead 12 is wedged between the contacting member 80 and the locking member 96. It should be noted that as the rounded end 102 of the locking member 96 begins to bend the lead 12 and engage the backup member 82, a wedging action takes place. This wedging action expands the tuning fork until the rounded end 102 has completely entered and the lead 12 and backup portion engage the relatively straight and parallel sides of the locking member 96. Further insertion toward the bottom 104 of the groove 56 will cause no further expansion of the tuning fork thereby keeping the contact force within a predictable range of between about 150 grams to about 220 grams.

An important advantage of the present invention is the low height which results from this novel structure. This low height socket is useful in compact machines such as small lap top computers, ultra thin wall hung display devices or televisions and many other applications having very limited space. Another important advantage of the present invention is the relatively short electrical path provided by the socket. The reduction of electrical length enables higher speed switching and provides substantial other related advantages. Further, the compact structure of the present invention utilizes a smaller amount of material than would otherwise be required, resulting in lower production costs. Another important advantage of the present invention is that a separate step to form the leads is unnecessary resulting in lower manufacturing cost and less chance of damaging the fragile leads. Additionally, since the contact force is supplied by energy stored in the tuning fork structure which acts literally with respect to the leads of the device, no hold down structure is needed as is required by prior art sockets.

I claim:

1. A low height chip carrier socket for electrically connecting leads on the chip carrier to respective pads on a mounting surface, wherein the leads are spaced apart and projecting from a peripheral edge of the chip carrier, said socket comprising:
   (a) a body having a chip carrier receiving cavity;
   (b) a plurality of contacts in said body arranged for electrically connecting each of said leads to a respective one of said pads, each said contact including a contacting portion and an opposed backup portion;
   (c) means for positioning and aligning each of said plurality of contacts with respective ones of said leads when said chip carrier is in said cavity so that each said lead is adjacent its respective contacting portion; and
   (d) locking means for wedging between each said lead and said backup portion so that each said lead is urged into pressing electrical contact with its respective contacting portion, said locking means including means for forming each said lead about the contacting portion of its respective contact.

2. The socket according to claim 1 wherein said contacting portion and said backup portion, both project from a common bight portion.

3. The socket according to claim 2 wherein said bight portion of each of said plurality of contacts is pivotally attached to said terminal by means of a pivotal zone.

4. The socket according to claim 1 wherein each of said plurality of contacts includes an expandable structure means for storing energy when said locking means is wedged between a respective lead and backup portion so that the stored energy acts to effect said pressing electrical contact.

5. The socket according to claim 4 wherein said expandable structure means includes a tuning fork portion comprising a contacting portion and an opposed backup portion both projecting from a common bight portion.

6. The socket according to claim 5 wherein said bight portion of each of said plurality of contacts is pivotally attached to said terminal by means of a pivotal zone.

7. The socket according to claim 1 including a cover, wherein said locking means includes a wedging member projecting from said cover and having a camming surface for engaging and forming each said lead about its respective contacting portion when said cover is assembled to said body.

8. The socket according to claim 7 wherein said body and said cover are of generally rectangular shape each having four sides, some of said plurality of contacts being disposed adjacent each of the four sides of said rectangular body and said cover including a said wedging member projecting from adjacent each of the four sides thereof.

9. The socket according to claim 8 wherein said cover includes a peripheral shroud projecting from the four sides thereof and arranged so that when said cover is assembled to said body, said shroud will slip over said body with minimum clearance between said body and said shroud thereby aligning said camming surfaces of said wedging members with respect to said contacting portions of said plurality of contacts.

10. The socket according to claim 9 wherein said body includes a bottom and four upstanding walls which form a chip carrier receiving cavity therewithin, a longitudinal groove being disposed in each wall including a plurality of slots disposed normal to said grooves, each slot arranged to receive one of said plurality of contacts, each longitudinal groove arranged to receive a respective one of said four wedging members so that when said cover is assembled to said body said camming surfaces will engage and form each said lead about its respective contacting portion.

11. The socket according to claim 1 wherein each of said contacts includes a contact portion and a terminal portion and said socket includes means for urging each of said terminals into engagement with said respective pads on said mounting surface.

12. The socket according to claim 11 wherein said body includes a bottom and four upstanding walls which form a chip carrier receiving cavity therewithin, laterally disposed slots being in each of said walls for receiving said plurality of contacts so that each terminal of said plurality of contacts project outwardly from said body toward said mounting surface, and wherein said means for urging each terminal into engagement with respective pads includes a fastener substantially centrally located with respect to said terminals, which is arranged to deflect said bottom toward said mounting surface.

13. In a method of terminating a chip carrier having a plurality of leads extending outwardly from said carrier, wherein each said lead is electrically connected to a respective contact which in turn is electrically connected to a respective pad on a substrate, the steps comprising:
   (a) shearing said leads to length;
   (b) placing said chip carrier into a base of a socket, so that each lead is adjacent a respective one of said contacts;
   (c) forming each lead, concurrently, about its respective said contact by forcing a camming surface of a locking member into engagement with said leads, deflecting them downwardly and bending them about their respective contacts; and
   (d) securing each said lead against and in pressing engagement with its respective said contact by wedging said locking member and each said lead between a contacting portion and a backup portion of said respective contact.

* * * * *